(12) United States Patent
Tsukihashi

(10) Patent No.: US 6,775,211 B1
(45) Date of Patent: Aug. 10, 2004

(54) SYSTEM AND METHOD FOR DISK RECORDING

(75) Inventor: Akira Tsukihashi, Ohra-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 777 days.

(21) Appl. No.: 09/717,608

(22) Filed: Nov. 21, 2000

(30) Foreign Application Priority Data

Nov. 29, 1999 (JP) .......................................... 11-337700

(51) Int. Cl.$^7$ ............................................. G11B 20/10
(52) U.S. Cl. .............................. 369/47.28; 369/53.31; 369/53.35
(58) Field of Search .......................... 369/47.28, 47.32, 369/47.19, 53.36, 47.24, 53.22, 124.07, 53.35, 59.25, 53.24; 710/59, 52; 711/111

(56) References Cited

U.S. PATENT DOCUMENTS

| 5,777,955 | A | * | 7/1998 | Ikeda et al. ............... | 369/47.19 |
| 5,831,955 | A | * | 11/1998 | Arataki et al. ........... | 369/47.32 |
| 6,091,686 | A | * | 7/2000 | Caffarelli et al. ........ | 369/53.24 |
| 6,512,724 | B1 | * | 1/2003 | Oishi ....................... | 369/53.35 |
| 6,522,608 | B1 | * | 2/2003 | Kuroda ..................... | 369/47.28 |

* cited by examiner

Primary Examiner—William Korzuch
Assistant Examiner—Kim-Kwok Chu
(74) Attorney, Agent, or Firm—Hogan & Hartson LLP

(57) ABSTRACT

When data recorded on a disk is traced in a reproduction mode, a selection circuit (28) is switched so as to select data read by said selection circuit (28). When a recording decision means (22) decides start of data recording, said selection circuit (28) is switched so as to select a reference clock. In this manner, a system clock generated from a system clock generation circuit (25) is gradually switched from a state which is synchronized with a bit clock to a state which is synchronized with a reference clock. According to the output system clock, recording data written on the disk is synchronized with the recorded data from a position continuous to the recorded data.

5 Claims, 2 Drawing Sheets

SYSTEM AND METHOD FOR DISK RECORDING

BACKGROUND OF THE INVENTION

1. Field of the Invention

The present invention relates to a disk recording system for recording data onto a disk using a light beam emitted from an optical head, and more particularly to a disk recording system which ensures continuity of recorded data.

2. Description of Related Art

CD-R (Recordable) drives or CD-RW (ReWritable) drives of the CD (Compact Disk) family are well known disk recording systems which record digital data on disks using laser light emitted from an optical head.

In such disk recording systems, recording speed or data stream conditions may lead to buffer underrun errors, which in turn causes the recording operation to be halted when generation of data to be recorded on the disk is interrupted.

For write-once media such as CD-R disks, a disk can no longer be used once the recording operation is halted.

For rewritable disks such as CD-RW disks, the disk remains usable, but, when recording is interrupted and resumed, recording must be repeated from the beginning.

A packet write system which records data in packet units provides one solution to this problem. The packet write system, however, requires as many as seven link blocks for connecting the packets and the disk recording capacity used in this manner is wasted.

Accordingly, when recording operation is interrupted and then resumed, if recording data can be recorded so as to be continuous to data already recorded on the disk prior to the interruption of recording without providing any link blocks in a case of track at once or session at once system, such a system would be preferable in light of compatibility with CD-ROM drives. Further, compared with a recording system which requires link blocks for connecting data when recording is resumed such as a packet write system, continuous data recording which requires no link blocks is more advantageous in terms of effective use of disk recording capacity. For these reasons, a disk recording system which can write recording data without requiring the use of link blocks has been in demand.

For continues data recording as described above, it is not only necessary that additional recording data be written so as to be continuous to data already recorded on a disk, but also that the start of data writing be synchronized with the data already recorded. As a result, the data linking processes are complicated.

In order to synchronize additional data to be written with data already recorded, it is necessary to extract a bit clock from data read from pits on the disk which form the recorded data, and to encode the recording data in accordance with the bit clock. Once writing starts, on the other hand, it is necessary to generate a more accurate reference clock synchronized with the bit clock so that the start of data recording is begun using the reference clock.

It is thus necessary to switch a system clock which functions as an operation clock used for a general operation regarding disk recording and reproducing between a bit clock and a more accurate reference clock. Specifically, during the operation for synchronizing data to be written with the recorded data, the system clock is a bit clock, which is switched to a reference clock when writing is started.

However, when the system clock is directly switched from a bit clock to a reference clock by a selection circuit when data writing is started, the following problem occurs. Namely, due to a phase deviation and speed variation, recording data which includes disturbance in clock components is written on a data portion before and after a link portion of the recording data. This will lead to an increased reproduction error at the data portion before and after the data link portion at the time of disk reproducing.

Further, direct switching from a bit clock to a reference clock by a selection circuit also creates a problem that peak signal disturbance is generated at the point of switching.

SUMMARY OF THE INVENTION

According to the present invention, a system clock generated from a system clock generation circuit is gradually switched from a state which is synchronized with a bit clock reproduced from pits of the recorded data to a state which is synchronized with a reference clock, and recording data is written on a disk in accordance with the system clock. It is thus possible to prevent data including significant disturbance in clock components from being recorded before and after data link portions of the disk to thereby reduce a reproduction error when the data portion before and after the data link portion is reproduced.

In particular, according to one preferred aspect, a system clock generation circuit comprises a single system PLL circuit, such that gradual switching of a system clock from a state which is synchronized with a bit clock to a state which is synchronized with a reference clock can be achieved with a simple structure.

In accordance with another aspect of the present invention, when a PLL circuit of a system clock generation circuit is locked after resumption of writing, a system clock generated from the system clock generation circuit is switched from a reference clock generated through the PLL circuit to a reference clock generated not through the PLL circuit. It is therefore possible to prevent adverse effect on the recording operation due to jitter components generated through the PLL circuit.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

Figure 1:
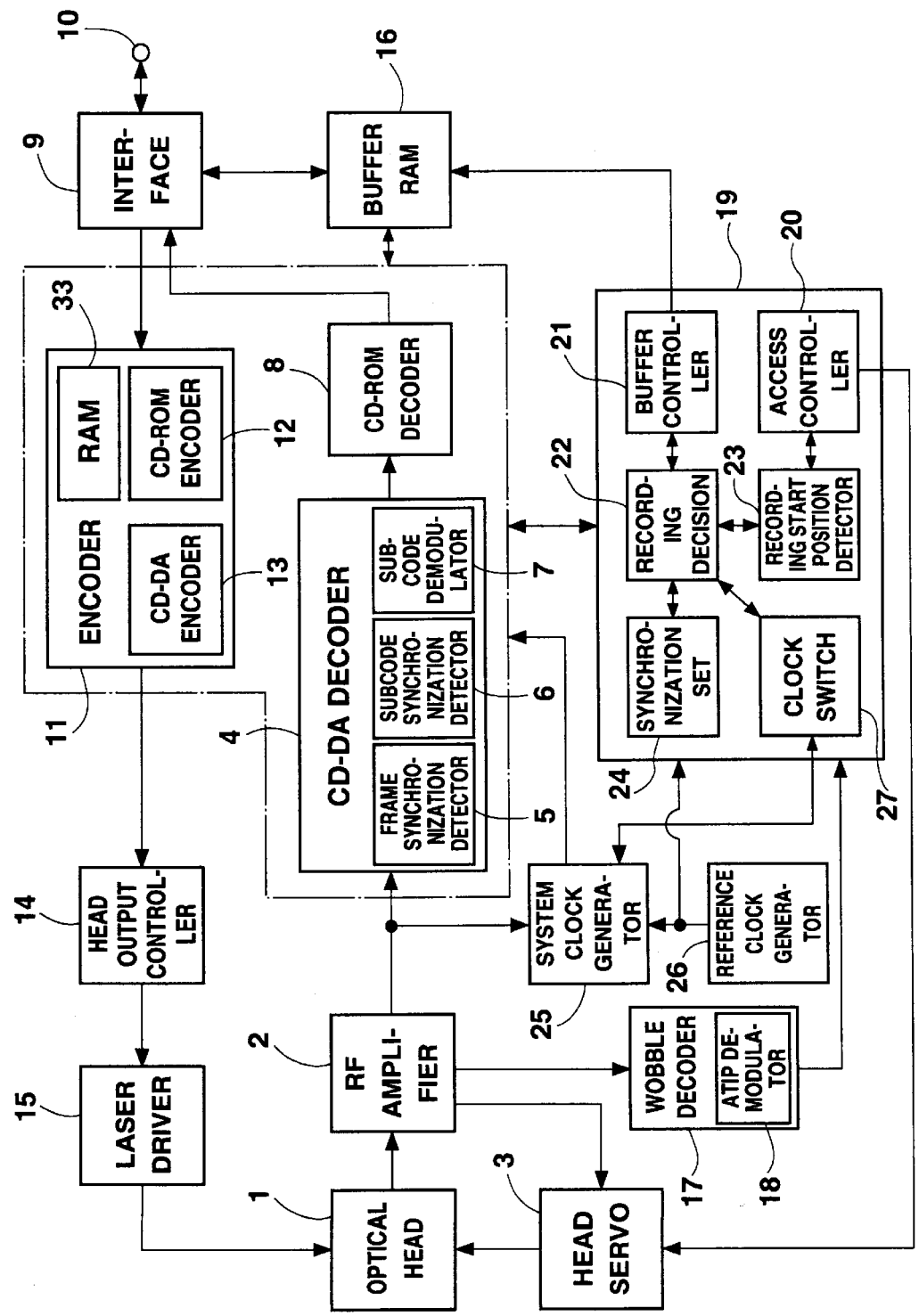
FIG. 1 is a block circuit diagram showing one embodiment of CD-R drive as an example for implementing a disk recording system according to the present invention.

FIG. 1 is a block circuit diagram showing an example of a CD-R drive as one embodiment of a disk recording system according to the present invention.

Referring to FIG. 1, an optical head 1 emits a laser to trace a signal track of a disk for writing/reading data onto/from the disk.

An RF amplifier 2 amplifies an RF signal (a radio frequency signal) of a received light output obtained from the optical head 1 and performs coding of the RF signal as binary data. A head servo 3 performs focusing control for feeding back various received light outputs obtained from the optical head 1 so as to focus a laser emitted from the optical head 1 on a signal surface of the disk, tracking control for causing the laser to follow a signal track of the disk, and thread feeding control for moving the optical head 1 in the radial direction of the disk.

To the binary data of an RF signal output from the RF amplifier 2, a CD-DA decoder 4 applies, in synch with a bit clock, a demodulation process in a range defined by a signal format of a CD-DA disk for use in audio only. The CD-DA decoder 4 separates various data from the input binary data of an RF signal and applies EFM (Eight to Fourteen Modulation) demodulation to EFM data. Also, the CD-DA decoder 4 comprises a frame synchronization detector 5 for detecting a frame synchronization signal indicative of a leading end of a frame of the EFM data (EFM frame), a subcode synchronization detector 6 for detecting a synchronization signal in a subcode consisting of 98 frames, and a subcode demodulator 7 for demodulating the subcode.

A CD-ROM decoder 8 applies, to the demodulated data obtained from the CD-DA decoder 4, a demodulation process in a range defined by a signal format of a CD-ROM disk. The CD-ROM decoder 8 performs synchronization detection of CD-ROM data defined by a signal format of the CD-ROM disk, and also performs error detection and error correction in accordance with an EDC (Error Detection Code) and an ECC (Error Correction Code) for CD-ROM data.

An interface 9 controls data transmission and data reception to and from a host device such as a personal computer externally connected via a connection terminal 10. An encoder 11 modulates data input to the interface 9 into recording data to be recorded onto a disk. The encoder 11 comprises a CD-ROM encoder section 12 which adds a sync, a header, an EDC and an ECC for CD-ROM data to the input data based on the CD-ROM standard and a CD-DA encoder section 13 which applies to the CD-ROM data encoded by the CD-ROM encoder section 12 an encoding process based on a CIRC (Cross Interleaved Reed-Solomon Code), which is an error correction code for a CD system, and adds a subcode, the data being further subjected to EFM and then a frame synchronization signal being added.

A head output controller 14 generates a control output for controlling the laser beam to be emitted from the optical head 1 based on the EFM data output from the encoder 11 as recording data. A laser driver 15 drives a laser source of the optical head 1 so as to record data on the disk in accordance with the control output supplied from the head output controller 14. The laser driver 15 sets the level of emission from the laser source of the optical head 1 at the time of recording to a recording level suitable for disk recording. In a state where the laser driver 15 permits irradiation from the laser source of the optical head 1, a signal "1" which constitutes the recording data is recorded on the disk, while in a state where the laser driver 15 prohibits irradiation from the laser source of the optical head 1, a signal "0" which constitutes the recording data is recorded on the disk.

A buffer RAM 16 stores the data input through the interface 9 before it is modulated into recording data to be recorded on the disk by the encoder 11. The buffer RAM 16 also stores data read from the disk before it is demodulated by the CD-DA decoder 4 and the CD-ROM decoder 8.

A wobble decoder 17 extracts wobble components of 22.05 kHz from a pre-groove signal of the disk obtained via the RF amplifier 2 to generate components required for rotation control of the disk and has an ATIP (Absolute Time In Pregroove) demodulating circuit 18 for demodulating an ATIP from the wobble components.

A system control circuit 19 executes system control with regard to disk recording and reproduction. Specifically, the system control circuit 19 comprises access control means 20 for controlling access by selectively referring to a subcode address of absolute time information in a subcode (sub Q data), which is demodulated by the subcode demodulating circuit 7 and to an ATIP address of absolute time information in ATIP which is demodulated by the ATIP demodulation circuit 18; buffer control means 21 for controlling data write/read with respect to the buffer RAM 16; recording decision means (recording controller) 22 for deciding interruption and start of data recording onto a disk according to the data amount stored in the buffer RAM 16 as a result of data read/write by the buffer control means 21 or according to instructions supplied from the host device connected to the connection terminal 10; recording start position detecting means 23 for detecting, as a recording start position on a disk, a position which is continuous to the terminal end of the already recorded data on the disk which becomes discontinuous by interruption of recording, when the recording decision means 22 decides start of recording; and synchronization setting means 24 for synchronizing new data to be recorded with the data already recorded on the disk by using the subcode synchronization signal detected by the subcode synchronization detection circuit 6 and the sub Q data demodulated by the subcode demodulating circuit 7. The system control circuit 19 may be a microcomputer operating as each of the aforementioned means through execution of programs. It may be preferable, however, for one or more of the aforementioned means to be hardware circuits.

A system clock generation circuit 25 generates a system clock which functions as an operation clock for a general operation regarding disk recording and reproduction. The system clock generation circuit 25 selectively generates, as a system clock, a bit clock extracted from the EFM data output from the RF amplifier 2 and a reference clock with the accuracy of a quartz oscillator generated from the reference clock generation circuit 26 constituted by a quartz oscillator. Selection between a bit clock and a reference clock to be output is performed by switching control of clock switching means 27.

Figure 2:
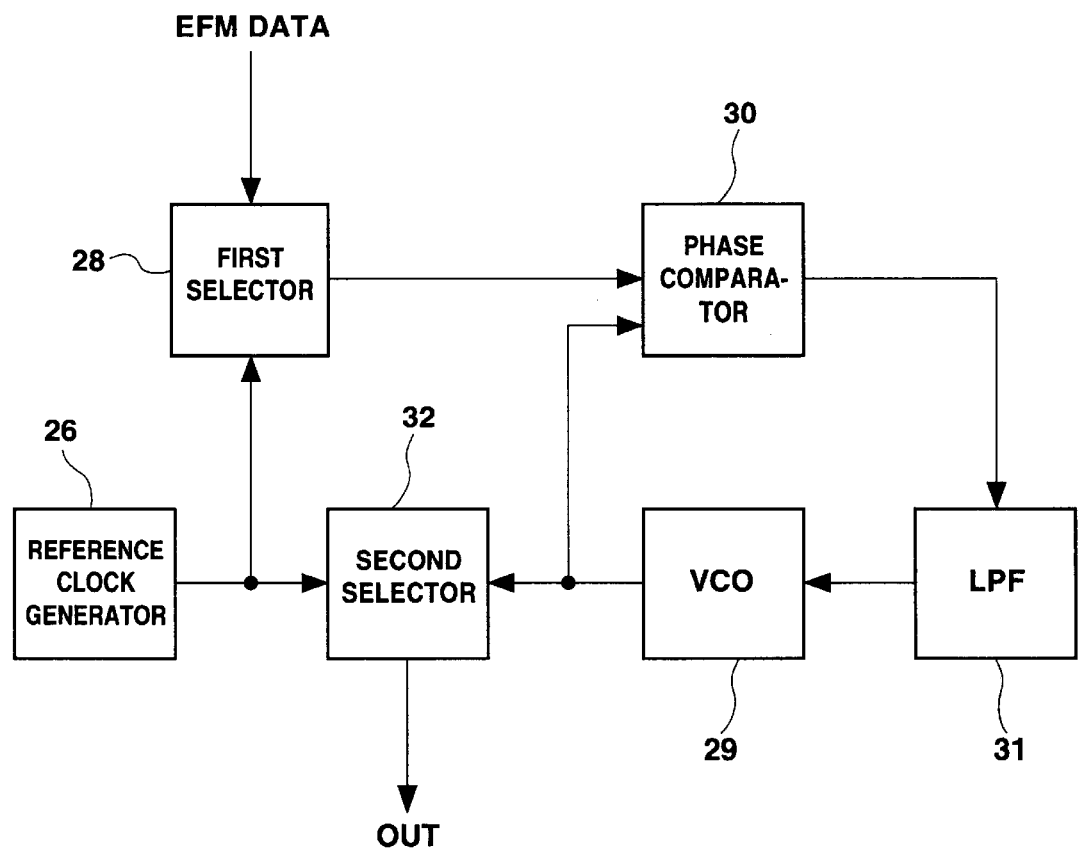
FIG. 2 is a block circuit diagram showing a detailed structure of a system clock generation circuit 25 which is a main circuit of the present invention.

As shown in FIG. 2, the system clock generation circuit 25 comprises a first selection circuit 28 into which a reference clock from a reference clock generator 26 and the EFM data output from the RF amplifier 2 are selectively input; a PLL (Phase Lock Loop) circuit; and a second selection circuit 32 for selectively outputting an oscillation clock output from a VCO (Voltage Controlled Oscillator) 29 and a reference clock generated from the reference clock generator 26. In the PLL circuit, the input clock selected by the first selection circuit 28 and an oscillation clock from the VCO 29 are input to a phase comparator 30 which compares the phases of these input clocks and outputs a voltage output according to the phase difference. The voltage output is converted into a DC voltage by a loop filter, namely a low pass filter (LPF) 31, which is then fed back to the VCO 29.

The recording operation of the disk recording system thus configured will be described.

When the host device connected to the connection terminal 10 supplies a demand for disk recording to the disk recording system and a recording operation is executed, the second selection circuit 32 is switched into a state which selects a reference clock generated from the reference clock generation circuit 26 under the switching control of the clock switching means 27. This places the system clock generation circuit 25 into a state for outputting a reference clock, such that each circuit for recording is prepared to operate synchronously with the reference clock.

Data to be recorded which is transmitted from the host device connected to the connection terminal 10 is received by the interface 9 and written into the buffer RAM 16.

When the amount of data received by the interface 9 and stored in the buffer RAM 16 reaches the data capacity with which the encoder 11 is set to start encoding, the data is read from the buffer RAM 16 and is demodulated by the encoder 11 for each EFM frame into recording data (EFM data) in the form to be recorded on the disk.

Once the tracing position of the optical head 1 reaches the recording start position on the disk, data to be recorded is sequentially output from the encoder 11 in EFM frame units, and address data of the ATIP address to be demodulated by the ATIP demodulation circuit 18 corresponding to the output data is sequentially updated and stored in the address memory (not shown) of the system control circuit 19.

Under the control of the head output control circuit 14, the laser drive circuit 15 drives a laser source of the optical head 1 based on the recording data output from the encoder 11, to thereby record the data on the disk.

When the amount of data received by the interface 9 becomes insufficient with regard to the amount of data to be recorded on the disk, so that the average data transfer rate for inputting data to the encoder 11 becomes lower than the average data transfer rate for outputting the recording data from the encoder 11, the amount of data stored in the buffer RAM 16 begins to decrease.

If such a state persists, the amount of data stored in the buffer RAM 16 eventually decreases to less than a predetermined amount, which results in buffer underruns of the buffer RAM 16. When such a buffer underrun state is determined, the recording decision means 22 decides to interrupt disk recording.

When recording by packet or session units is completed, the recording decision means 22 decides to interrupt disk recording until the amount of data received by the interface 9 and stored in the buffer RAM 16 reaches the data amount with which the encoder 11 can begin the encoding process.

When the recording decision means 22 decides interruption of disk recording, an encoding operation for the input data performed by the encoder 11 is interrupted and a control output supplied from the head output control circuit 14 for controlling the laser drive circuit 15 is also halted, so that emission of a laser from the optical head 1 for recording is stopped to thereby interrupt the disk recording. At this time, since no link blocks (run-out) for connecting the recording data are generated by the encoder 11, the disk recording is interrupted without recording such link blocks.

Then, when data to be recorded is received by the interface 9 and the amount of data stored in the buffer RAM 16 reaches the data amount with which the encoder 11 starts encoding process, the recording decision means 22 decides to resume disk recording.

In response to the decision to resume recording made by the recording decision means 22, the encoder 11 resumes encoding operation for additional data to be recorded.

At this time, if the encoder 11 resumes the encoding process for data which is continuous to the data processed immediately before the interruption of recording, data corresponding to the interleave length of a CIRC (maximally 108 frames for EFM frames) is secured for the data to be encoded immediately after resumption of recording by the data stored in an internal RAM 33 in the encoder 11. Therefore, the encoding process is started using the data stored in the internal RAM 33 immediately before the interruption of recording, as required.

Further, when the recording decision means 22 decides to resume disk recording, the head output control circuit 14 sets the level of an emission output from the optical head 1 to a reproduction level and the optical head 1 is positioned to access data in the vicinity of the trailing end of the recorded data on the disk, by referring to the last ATIP address stored immediately before interruption of recording.

Also, when the recording decision means 22 decides to resume recording, the recording start position detection means 23 detects the trailing end of the data recorded on the disk immediately before interruption of recording to thereby detect, as the recording start position, the leading end of a non-recorded portion of the disk which is continuous to the detected trailing end of the data.

The detection of the recording start position by the recording start position detection means 23 is performed as follows. When the optical head 1 is located to access a data portion prior to the trailing end of the recorded data in response to the decision to start recording by the recording decision means 22, the optical head 1, under the tracing state in a reproduction mode, refers to the last subcode address stored immediately before the interruption of recording, to access the EFM frame one frame before the subcode address. Then, a frame synchronization signal is detected to count the EFM frames so as to detect the last EFM frame of the subcode frame corresponding to the subcode address. Upon detecting a frame synchronization signal of the last EFM frame, bit clocks are counted to detect the trailing end position of the data already recorded on the disk. The position immediately after the detected trailing end position is detected as the recording start position.

When the disk is traced in the reproduction mode so that EFM data from the RF amplifier 2 begins to be input into the system clock generation circuit 25, the clock switching means 27 switches the first selection circuit 28 into a state which selects the EFM data output from the RF amplifier 2 and also switches the second selection circuit 32 into a state which selects an oscillation clock from the VCO 29.

Accordingly, the EFM data from the RF amplifier 2 is input via the first selection circuit 28 to the PLL circuit, which extracts a bit clock from the EFM data. The bit clock extracted by the PLL circuit is output via the second selection circuit 32. In this manner, the system clock generation circuit 25 is ready to generate the bit clock as a system clock.

During the tracing state in the reproduction mode when detecting the recording start position of the disk, a decoding process by the CD-DA decoder 4 is performed in synchronism with a system clock generated from the system clock generation circuit 25, in this case, the bit clock. At the same time, the synchronization setting means 24 causes the encoder 11 to perform encoding process in synchronism with the bit clock. Therefore, recording data generated by the encoder 11 is synchronized with the data recorded on the disk.

When the recording start position on the disk is detected, the clock switching means 27 switches the first selection circuit 28 into a state which selects a reference clock generated by the reference clock generation circuit 26 and holds the second selection circuit 32 in a state which selects an oscillation clock from the VCO 29.

Thus, an oscillation clock from the VCO 29 of the PLL circuit which has been synchronized with a bit clock is gradually synchronized with a reference clock, so that an oscillation clock which is synchronized with this reference clock is output via the second selection circuit 32.

Then, when the PLL circuit is in a locked state and the oscillation clock from the VCO 29 is synchronized with a reference clock, the clock switching means 27 switches the second selection circuit 32 into a state which directly selects a reference clock generated by the reference clock generation circuit 26.

Namely, the system clock generation circuit 25 generates, as a system clock, an oscillation clock output from the PLL circuit which has been synchronized with a bit clock and is gradually synchronized with a reference clock. Once the oscillation clock output from the PLL circuit is in synchronism with a reference clock, the system clock generation circuit 25 generates, as a system clock, a reference clock which is generated not through the PLL circuit but directly from the reference clock generation circuit 26.

In this manner, the operation clock of the encoder 11 is switched into a system clock synchronized with a reference clock when the recording start position on the disk is detected, such that the encoding process by the encoder 11 is performed in synchronism with the reference clock.

According to this embodiment, gradual switching of a system clock from a state which is synchronized with a bit clock to a state which is synchronized with a reference clock can be achieved using the system clock generation circuit comprising one system PLL circuit, which results in a simplified structure.

On the other hand, when the recording start position on the disk is detected, the head output control circuit 14 generates a control output based on the recording data to be written which is ready to be output by the encoder 11, so that the data to be written at the leading end of the non-recorded portion of the disk can be recorded in synchronism with the recorded data on the disk.

Accordingly, the writing of additional recording data to be written onto the disk is synchronized with a system clock which continuously and gradually changes from a bit clock reproduced from pits of the already recorded data to a reference clock.

It is thereby possible to prevent recording data including significant disturbance in clock components from being recorded on the disk before and after the data link portion generated by such data writing.

Further, after the output from the VCO 29 is locked to the output from the reference clock generation circuit 26, the system clock generated from the system clock generation circuit 25 is switched from a reference clock generated through the PLL circuit to a reference clock generated not through the PLL circuit but directly from the reference clock generation circuit 26. Thus, adverse effect on the recording operation due to jitter components generated through the PLL circuit can be eliminated.

According to this embodiment, when data recording is resumed, no link blocks (LINK and run-in) for connecting the recording data are generated by the encoder 11, so that disk recording is started without such link blocks being recorded on the disk.

It is therefore possible to write data on the disk without recording link blocks on the link portion at the leading end of the recording data to be written and also without providing any link blocks at the trailing end of the recorded data when the recording is interrupted, thereby allowing effective use of the recording capacity of the disk. As described above, according to this embodiment, recording is smoothly started at the time of resumption of recording in accordance with a system clock which gradually changes, and therefore preferable recording can be achieved without requiring any link blocks.

In the example of the preferred embodiment, when the PLL circuit is locked after resumption of data writing, the system clock generated from the system clock generation circuit 25 is switched from a reference clock generated through the PLL circuit to a reference clock generated directly from the reference clock generation circuit 26 not through the PLL circuit. However, such switching of a reference clock is not necessary as long as the jitter components generated by the PLL circuit fall within an allowable range. In that case, the second selection circuit 32 can be eliminated.

Although a CD-R drive has been described as an example of the present invention, the present invention is not limited to this example and is applicable to disk recording systems other than CD-R drives.

While the preferred embodiment of the present invention has been described using specific terms, such description is for illustrative purposes only, and it is to be understood that changes and variations may be made without departing from the spirit or scope of the appended claims.

What is claimed is:

1. A disk recording system for recording data on a disk using a light beam emitted from an optical head, comprising:
    an encoder for encoding input data to generate recording data to be written on the disk;
    recording controller for deciding interruption and resumption of data recording on the disk;
    recording start position detector for detecting a recording start position at which writing of the recording data on the disk is resumed when said recording decision means decides resumption of data recording;
    synchronization setter for synchronizing, when said recording controller decides resumption of data recording, the recording data to be written on the disk with data already recorded on the disk immediately before interruption of recording; and
    a system clock generation circuit for generating a system clock serving as an operation clock for system control,
    wherein said system clock generation circuit includes:
    a PLL circuit for generating and outputting a clock in accordance with an input signal; and
    a first selection circuit for selectively inputting data read out from the disk and a reference clock which is an operation clock of said encoder at the time of recording, to said PLL circuit, and
    wherein said first selection circuit selects said read out data for input to said PLL circuit when the data already recorded on the disk is traced and selects said reference clock for input to said PLL circuit when said recording decision means decides resumption of data recording.

2. A disk recording system according to claim 1,
    wherein said system clock generation circuit comprises a second selection circuit for selectively outputting an output clock from said PLL circuit and said reference clock, and
    wherein said second selection circuit is switched into a state in which said reference clock is output when the recording decision means decides resumption of data recording and a locked state of said PLL circuit is detected.

3. A disk recording system for recording data on a disk using a light beam emitted from an optical head, comprising:
   an encoder for encoding input data to generate recording data to be written on the disk; and
   a system clock generation circuit for supplying an operation clock to said encoder, wherein
   said system clock generation circuit outputs, while a recording start position is being detected by tracing recorded portions on the disk by said optical head after resumption of disk recording, a bit clock extracted from read data obtained by said tracing as said operation clock, and outputs a clock which continuously changes from said bit clock to a predetermined reference clock for data recording as said operation clock when said recording start position is detected; and
   wherein said system clock generation circuit comprises:
   a PLL circuit including a phase comparator, a voltage controlled oscillator (VCO), and a loop filter for providing an output from said VCO as said operation clock;
   a reference clock generation circuit for generating said reference clock; and
   a first selection circuit for inputting, while a recording start position is being detected by tracing recorded portions on said disk, said read data obtained by the tracing to the phase comparator of said PLL circuit and inputting said reference clock to the phase comparator of said PLL circuit when said recording start position is detected.

4. A disk recording system according to claim 3 comprising a second selection circuit for selecting either a reference clock output from said reference clock generation circuit or an output from the VCO of said PLL circuit,
   wherein said second selection circuit selects an output from said VCO for output until an output from said VCO is locked with regard to said reference clock and selects said reference clock for output when said output from said VCO is locked with regard to said reference clock.

5. A disk recording system for recording data on a disk using a light beam emitted from an optical head, comprising:
   an encoder for encoding input data to generate recording data to be written on the disk; and
   a system clock generation circuit for supplying an operation clock to said encoder, wherein
   said system clock generation circuit outputs while a recording start position is being detected by tracing recorded portions on the disk by said optical head after resumption of disk recording, a bit clock extracted from read data obtained by said tracing as said operation clock, and outputs a clock which continuously changes from said bit clock to a predetermined reference clock for data recording as said operation clock when said recording start position is detected; and
   wherein said encoder generates no link block data at the point of interruption and resumption of recording.

* * * * *